United States Patent
Jo et al.

(10) Patent No.: US 10,454,061 B2
(45) Date of Patent: Oct. 22, 2019

(54) ORGANIC ELECTROLUMINESCENT DISPLAY DEVICE AND METHOD OF SEALING THE SAME

(71) Applicant: LG DISPLAY CO., LTD., Seoul (KR)

(72) Inventors: Jang Jo, Seoul (KR); Jongsung Kim, Paju-si (KR); Hyunggeun Kwon, Gunpo-si (KR)

(73) Assignee: LG DISPLAY CO., LTD., Seoul (KR)

(*) Notice: Subject to any disclaimer, the term of this patent is extended or adjusted under 35 U.S.C. 154(b) by 31 days.

(21) Appl. No.: 15/533,135

(22) PCT Filed: Oct. 5, 2015

(86) PCT No.: PCT/KR2015/010502
§ 371 (c)(1),
(2) Date: Jun. 5, 2017

(87) PCT Pub. No.: WO2016/088998
PCT Pub. Date: Jun. 9, 2016

(65) Prior Publication Data
US 2017/0331072 A1  Nov. 16, 2017

(30) Foreign Application Priority Data
Dec. 5, 2014 (KR) .......... 10-2014-0174222

(51) Int. Cl.
*H01L 51/52* (2006.01)
*H01L 27/32* (2006.01)
(Continued)

(52) U.S. Cl.
CPC ........ *H01L 51/5246* (2013.01); *H01L 27/322* (2013.01); *H01L 27/3244* (2013.01);
(Continued)

(58) Field of Classification Search
CPC .............. H01L 51/5246; H01L 51/525; H01L 51/5253; H01L 51/5256; H01L 51/0097;
(Continued)

(56) References Cited

U.S. PATENT DOCUMENTS 6,982,524 B2 * 1/2006 Park ................ H01L 27/3253
257/81
8,466,616 B2 * 6/2013 Choi ................ H01L 51/524
313/504

(Continued)

FOREIGN PATENT DOCUMENTS

JP  2011-165422    *  8/2011
JP  2011-165422 A     8/2011
(Continued)

*Primary Examiner* — Michael M Trinh
(74) *Attorney, Agent, or Firm* — Birch, Stewart, Kolasch & Birch, LLP (57) ABSTRACT

This disclosure relates to an organic electroluminescent display device and a method of sealing the same capable of reducing a manufacturing time and a complexity of manufacturing process. The organic electroluminescent display device comprises a first substrate including an active area and a bezel area outside the active area, the first substrate including an organic light emitting layer and a passivation film covering the organic light emitting layer thereon; a second substrate facing to the first substrate; and a filling layer in a space between the first substrate and the second substrate, wherein the filling layer includes; a first region having a first hardness, and spaced apart at a predetermined distance from the a passivation film to surround the protective layer in the bezel area; and a second region having a second hardness lower than the first hardness, and positioned inside the first region to be contacted with the first region.

15 Claims, 8 Drawing Sheets

(51) Int. Cl.
*H01L 51/56* (2006.01)
*H01L 51/00* (2006.01)

(52) U.S. Cl.
CPC ...... *H01L 51/0097* (2013.01); *H01L 51/5259* (2013.01); *H01L 51/5284* (2013.01); *H01L 51/56* (2013.01); *H01L 2251/5338* (2013.01)

(58) Field of Classification Search
CPC ... H01L 51/5284; H01L 51/56; H01L 27/322; H01L 27/3244; H01L 2251/5338; H01L 27/1214; H01L 27/1251; H01L 51/5259
See application file for complete search history.

(56) References Cited

U.S. PATENT DOCUMENTS

| | | |
|---|---|---|
| 2007/0170861 A1 | 7/2007 | Lee et al. |
| 2007/0172971 A1* | 7/2007 | Boroson ............. H01L 51/5246 438/26 |
| 2008/0143247 A1 | 6/2008 | Kim et al. |
| 2010/0012966 A1 | 1/2010 | Choi et al. |
| 2012/0048462 A1* | 3/2012 | Lee ....................... B32B 37/185 156/272.8 |
| 2012/0169229 A1* | 7/2012 | You ..................... H01L 27/3244 315/51 |
| 2013/0248891 A1* | 9/2013 | Kim .................... H01L 51/0097 257/88 |

FOREIGN PATENT DOCUMENTS

| | | |
|---|---|---|
| KR | 10-2008-0055243 A | 6/2008 |
| KR | 10-2008-0101112 A | 11/2008 |
| KR | 10-2010-0009057 A | 1/2010 |
| KR | 10-2012-0049021 A | 5/2012 |
| KR | 10-2013-0000286 A | 1/2013 |

* cited by examiner

ORGANIC ELECTROLUMINESCENT DISPLAY DEVICE AND METHOD OF SEALING THE SAME

CROSS-REFERENCE TO RELATED APPLICATION

This application is the National Phase of PCT International Application No. PCT/KR2015/010502 filed on Oct. 5, 2015, which claims priority under 35 U.S.C. 119(a) to Korean Patent Application No. 10-2014-0174222 filed on Dec. 5, 2014 in Republic of Korea. All of these applications are hereby expressly incorporated by reference into the present application.

BACKGROUND OF THE INVENTION

Technical Field

This disclosure relates to an organic electroluminescent display device and a method of sealing the same and more particularly to an organic electroluminescent display device and a method of sealing the same capable of reducing a manufacturing time and a complexity of manufacturing process.

Background Art

The electroluminescent display device has self-emission characteristics, and does not require a separate light source unlike a liquid crystal display device, so that its thickness and weight can be reduced. The electroluminescent display device exhibits high-quality characteristics such as low power consumption, high luminance, and high reaction rate.

Figure 1:
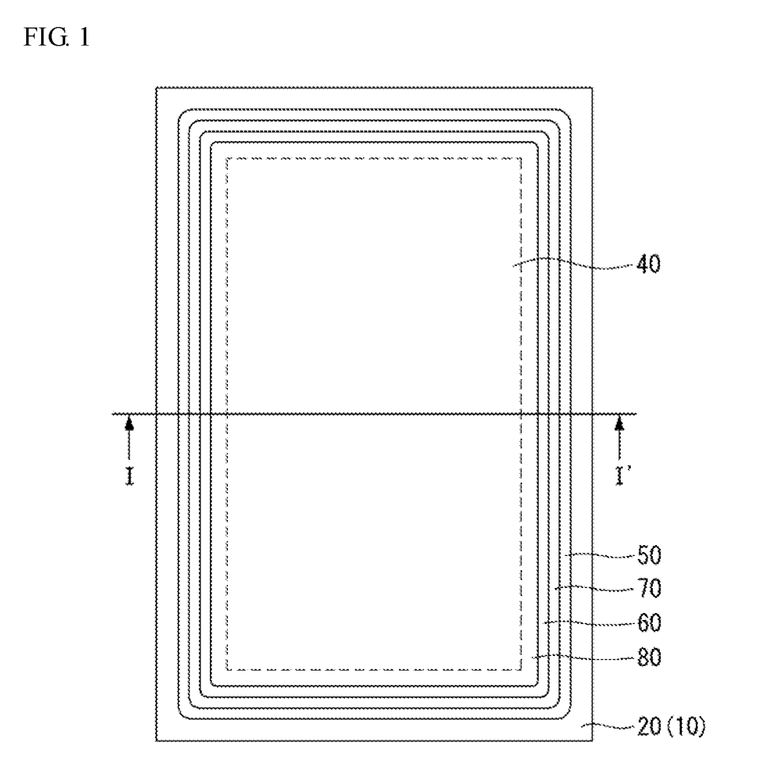
FIG. 1 is a plan view illustrating a related art organic electroluminescent display device.

Hereinafter, a related art electroluminescent display device will be described with reference to FIGS. 1 and 2. FIG. 1 is a plan view of a related art electroluminescent display device, and FIG. 2 is a cross-sectional view taken along line I-I' of FIG. 1.

Figure 2:
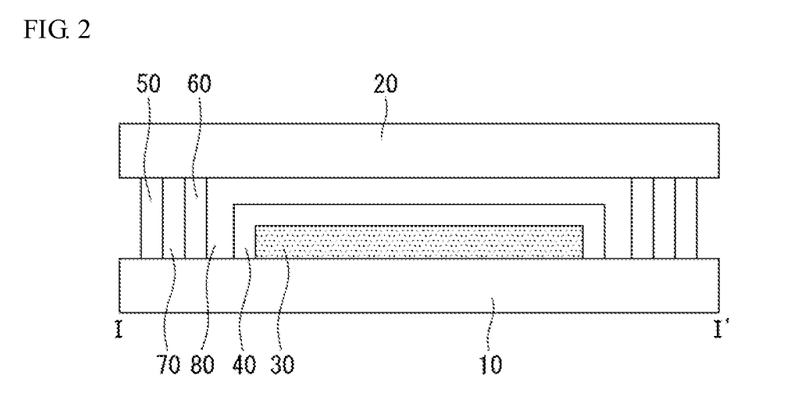
FIG. 2 is a cross-sectional view taken along line I-I' of FIG. 1.

Referring to FIGS. 1 and 2, the electroluminescent display device includes a first substrate 10, a second substrate 20, an organic light emitting element layer 30 disposed on the first substrate 10, a passivation film 40, an external sealant 50, a dam 60, 70, and a filling material 80.

The organic light emitting element layer 30 is a layer including display elements such as data lines, gate lines, thin film transistors, and organic light emitting diodes formed on the first substrate 10. The passivation film 40 covers the organic light emitting element layer 30 to block penetration of oxygen and moisture from being penetrated into the organic light emitting element layer 30 from the outside. The second substrate 20 is disposed opposite to the first substrate 10 with the organic light emitting element layer 30 and the protective film 40 therebetween. The first substrate 10 and the second substrate 20 are assembled and sealed by the outer sealant 50 and the dam 60. Reference number 80 indicates the filling material which is disposed in a space between the first substrate 10 and the second substrate 20. The filling material 80 supports the second substrate 20 so that the second substrate 20 disposed at an upper side is not bent.

The dam 60 is disposed to surround the protective film 40 between the protective film 40 covering the organic light emitting element layer 30 and the external sealant 50. The dam 60 is disposed between the second substrate 20 and the protective film 40 to suppress the filler material 80 from flowing down. The dam 60 assembles and seals the first substrate 10 and the second substrate 20 together with the external sealant 50.

The getter 70 is disposed between the dam 60 and the external sealant 50. The getter 70 is sealed by the outer sealant 50, the dam 60, the first substrate 10, and the second substrate 20. The getter 70 has a moisture absorption property and cuts moisture to block moisture from penetrating into the organic light emitting element layer 40 through the external sealant 50 from the outside. The moisture from the outside of the organic electroluminescent display device is sequentially blocked by the external sealant 50, the getter 70, the dam 60, and the protective film 40. Therefore, it is possible to block moisture from being reached to the organic light emitting element layer 30 disposed at the inside.

However, in the organic electroluminescent display device, the outer sealant 50, the getter 70, the dam 60, and the filler material 80 are formed through individual processes using different materials in order to block penetration of moisture. Accordingly, there are some problems that manufacturing time is long and manufacturing process is complicated.

Also, when the first substrate 10 and the second substrate 20 are assembled and sealed using the external sealant 50 and the dam 60, an internal pressure generated between the first substrate 10 and the second substrate 20. And then when the getter 70 is penetrated to the inside due to the internal pressure, a gas is generated from the getter 70. Accordingly, there is a problem that the gas penetrates into the light emitting layer 30, thereby causing defects in organic light emitting elements.

SUMMARY OF THE INVENTION

An object of this disclosure has been made to solve the above-mentioned problems, and it is an object of this disclosure to provide an organic electroluminescent display device and a method of sealing the same capable of reducing a manufacturing time and a complexity of the manufacturing process, which have been caused by forming the sealant, the getter, the dam and the filling material through individual processes.

To achieve the above objects, an organic electroluminescent display device according to the present invention comprises a first substrate including an active area and a bezel area outside the active area, the first substrate including an organic light emitting layer and a passivation film covering the organic light emitting layer thereon; a second substrate facing to the first substrate; and a filling layer in a space between the first substrate and the second substrate, wherein the filling layer includes; a first region having a first hardness, and spaced apart at a predetermined distance from the a passivation film to surround the protective layer in the bezel area; and a second region having a second hardness lower than the first hardness, and positioned inside the first region to be contacted with the first region.

The first substrate further includes color filters on the passivation film, and a black matrix partitioning the color filters, and the second substrate is an encapsulating substrate.

The second substrate further includes color filters on the passivation film, and a first black matrix partitioning the color filters.

The first region is an area cured by ultraviolet cure and heat cure, and the second region is an area cured by heat cure.

The second substrate further includes at least one second black matrix spaced apart from the first black matrix by a predetermined distance and surrounding the first black matrix in the bezel area, the filling layer further includes a third region overlapping the second black matrix, and the third region has a hardness less than the first hardness.

The third region is an area cured by the heat cure.

The first region is at inside and outside the third region to be contacted with the third region.

The filling layer is made of a filling material cured in reaction to ultraviolet ray and heat.

The filling material includes any one of acrylic-based resin, epoxy-based resin, silicone-based resin and rubber-based resin, or a mixture thereof.

To achieve the above objects, a method of sealing an organic electroluminescent display device according to the present invention comprises: disposing an organic light emitting element layer and a passivation film covering the organic light emitting element layer on a first substrate including an active area and bezel area outside the active area; applying a filling material to the passivation film; aligning a second substrate to face the first substrate, and then attaching the first substrate and the second substrate together; forming a first region having a first hardness in the filling material by irradiating ultraviolet ray to the bezel area spaced from the organic light emitting element layer by a predetermined distance; and forming a second region having a second hardness less than the first hardness in the filling material inside the first region by heating to the active area and the bezel area, thereby forming a filling layer having the first region and the second region.

In the forming the first region, the ultraviolet ray is irradiated using a mask having an opening at a portion corresponding to the first region.

The second substrate further includes color filters, a first black matrix partitioning the color filters, and at least one second black matrix spaced apart from the first black matrix by a predetermined distance and disposed to surround the first black matrix in the bezel area, the forming the first region further includes aligning the first substrate and the second substrate so that the at least one second black matrix is positioned to a portion corresponding to the first region, and the first region is formed at both sides of the second black matrix by irradiating the ultraviolet ray to the bezel area using the second black matrix as a mask.

In the forming the second region, the second region having the second hardness lower than the first hardness is formed inside from the first region by heating to the active area and the bezel area, and a filling layer having a second hardness lower than the first hardness in areas under the second black matrix and between the first regions is formed.

According to the organic electroluminescent display device and the method of sealing the same, since a first region is cured by a first cure using an ultraviolet irradiation to function as a dam, it is possible to suppress the spreading of filling material, and decrease a misalignment of the first and second substrates after first substrate and the second substrate are assembled.

Also, since the first region functions as a getter and does not generate a gas, it is possible to easily and safely absorb moisture permeated from the outside.

Also, since viscosity of a second region and a third region is lowered by a second cure using a thermal cure, it is possible to effectively control spreading the filling material into the first region.

Also, since it is possible to easily obtain the first region functioning as a dam and getter, and the second and third regions functioning as a sealant only by ultraviolet cure and thermal cure using a same material, it is possible to reduce a manufacturing time and a complexity of the manufacturing process, which have been caused by forming the sealant, the getter, the dam and the filling material through individual processes.

DETAILED DESCRIPTION

Hereinafter, exemplary embodiments of this invention will be described in detail with reference to the accompanying drawings, wherein same reference numerals may be used to denote the same or substantially the same elements throughout the specification and the drawings. In the following description, well-known functions or constructions related to this disclosure are not omitted if they would obscure gist of this disclosure in unnecessary.

Figure 3:
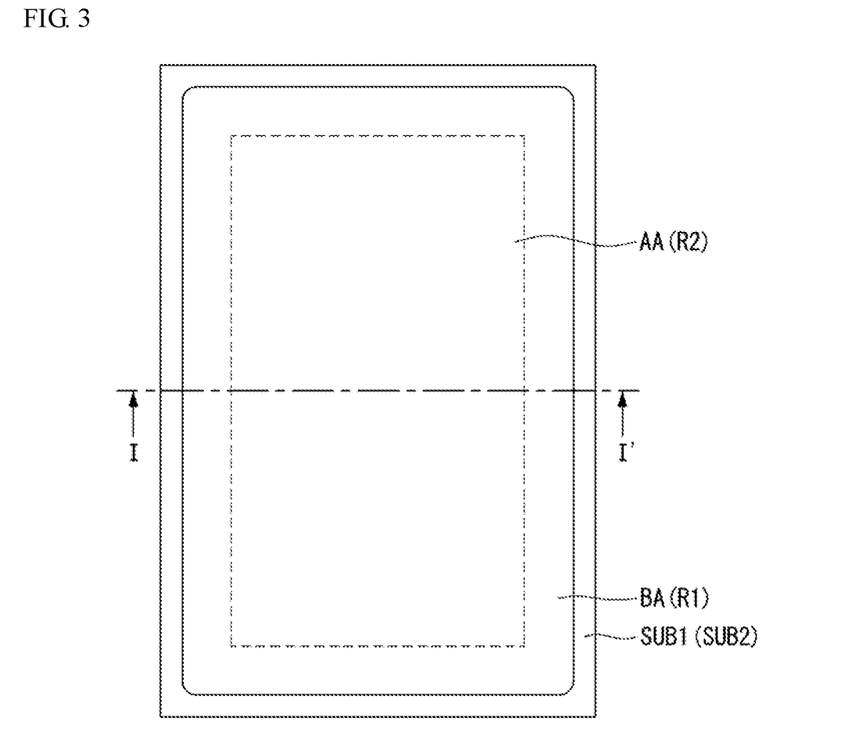
FIG. 3 is a plan view schematically illustrating an organic electroluminescent display device according to a first embodiment of this disclosure.
Figure 4:
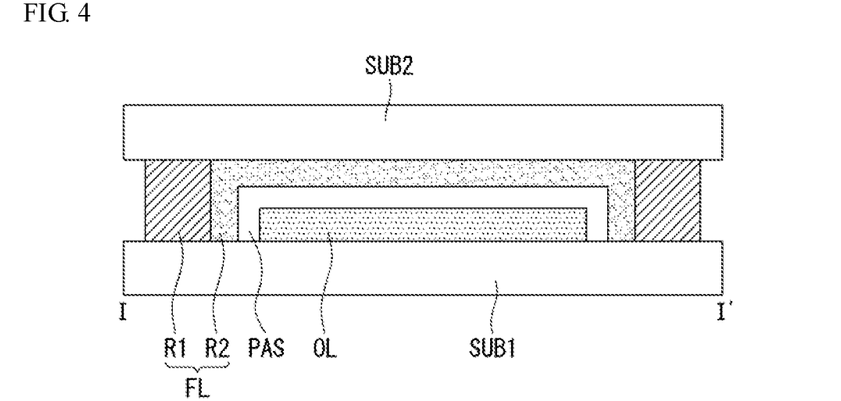
FIG. 4 is a cross-sectional view as one example taken along line I-I' of the organic electroluminescent display device according to the first embodiment of this disclosure shown in FIG. 3.

FIG. 3 is a plan view schematically illustrating an organic electroluminescent display device according to a first embodiment of this disclosure, and FIG. 4 is a cross-sectional view as one example taken along line I-I' of the organic electroluminescent display device according to the first embodiment of this disclosure shown in FIG. 3.

Referring to FIGS. 3 and 4, the organic electroluminescent display device according to the first embodiment of this disclosure includes a first substrate SUB1, a second substrate SUB2, an organic light emitting element layer OL disposed on the first substrate SUB1, a passivation film PAS, and a filling layer FL.

The organic light emitting element layer OL a layer including display elements such as data lines, gate lines, thin film transistors, and organic light emitting diodes formed on the first substrate SUB1. The passivation film PAS covers the organic light emitting element layer OL to block oxygen and moisture from being penetrated into the organic light emitting element layer OL. The passivation film PAS may consist of a plurality of layers in which an inorganic protective film and an organic protective film are alternately disposed. The inorganic protective film is more suitable than the organic protective film in blocking penetration of oxygen and moisture. The organic protective film can serve to complement the impact resistance of the inorganic protective film.

The filling layer FL is filled between the passivation film PAS on the first substrate SUB1 and the second substrate SUB2. The filling layer FL is disposed between the first substrate SUB1 and the second substrate SUB2 to be separated from the passivation film PAS in a predetermined distance so as to support the second substrate SUB2 disposed at the upper side. The filling layer FL may include a material which can be cured in both ultraviolet ray and heat. The material of the filling layer FL may be any one of acrylic-based resin, epoxy-based resin, silicone-based resin and rubber-based resin, or a mixture thereof.

The filling layer FL includes a first region R1 and a second region R2. The first region R1 is disposed on a bezel area BA surrounding an active area AA on which images are displayed. The second region R2 is positioned in a space formed by the first region R1, the second substrate SUB2 and the passivation film PAS. The first region R1 of the filling layer FL has a higher intensity than the second region R2.

Figure 5:
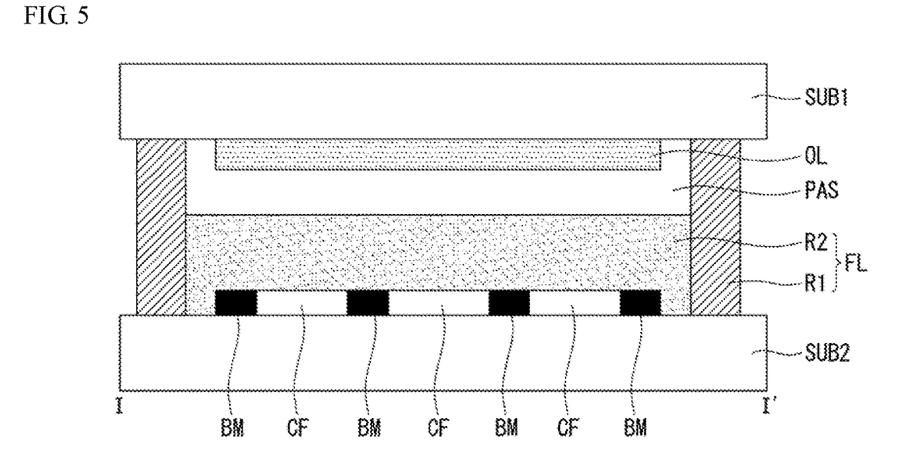
FIG. 5 is a cross-sectional view illustrating an example of an organic electroluminescent display device including color filters and a black matrix for partitioning the color filter disposed on a second substrate.

The second substrate SUB 2 may include color filters CF and a black matrix BM for partitioning the color filters CF as shown in FIG. 5. FIG. 5 is a cross-sectional view illustrating an example of an organic electroluminescent display device including color filters and a black matrix for partitioning the color filter disposed on a second substrate.

Next, the sealing process of the organic electroluminescent display device shown in FIG. 5 will be described with reference to FIGS. 6a to 6d.

Figure 6A:
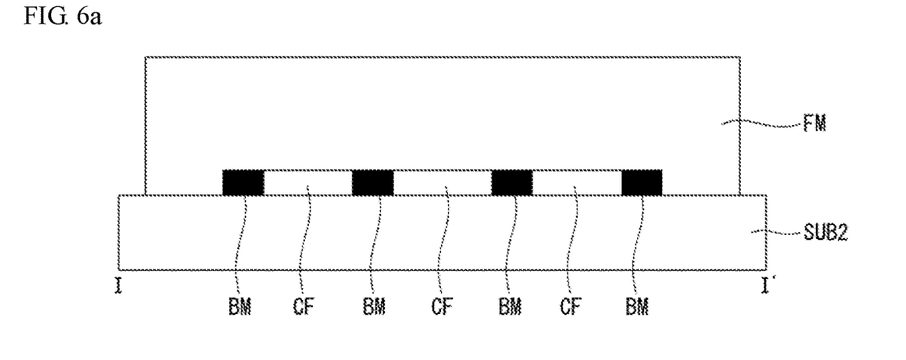
FIGS. 6a to 6d are cross-sectional views illustrating assembling processes of the organic electroluminescent display device shown in FIG. 5.

Referring to FIG. 6a, a filling material FM made of any one of acrylic-based resin, epoxy-based resin, silicone-based resin and rubber-based resin or a mixture thereof is applied on the second substrate SUB2 on which the color filters CF and the black matrix BM for partitioning the color filters CF are disposed. The filling material FM has a viscosity of approximately 1,000 cp to 50,000 cp and is applied by a screen printing method, an ink-jet method, a slot dye coating method and so on.

Figure 6B:
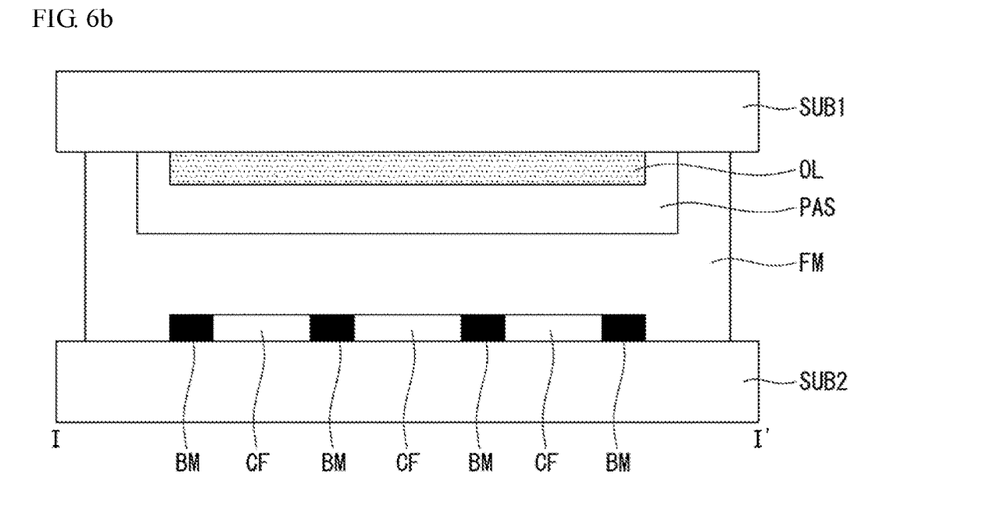

Referring to FIG. 6b, the first substrate SUB1 on which the organic light emitting element layer OL and the passivation film PAS are positioned is aligned to face the filling material FM located on the second substrate SUB2. And then the first substrate SUB1 is attached to the second substrate SUB2 by a vacuum attachment method and so on. The filling material FM positioned on the second substrate SUB2 by the attachment of the first substrate SUB1 and the second substrate SUB2 moves to the outside of the passivation film PAS and is filled into an empty space between the first substrate SUB1 and the second substrate SUB2.

Figure 6C:
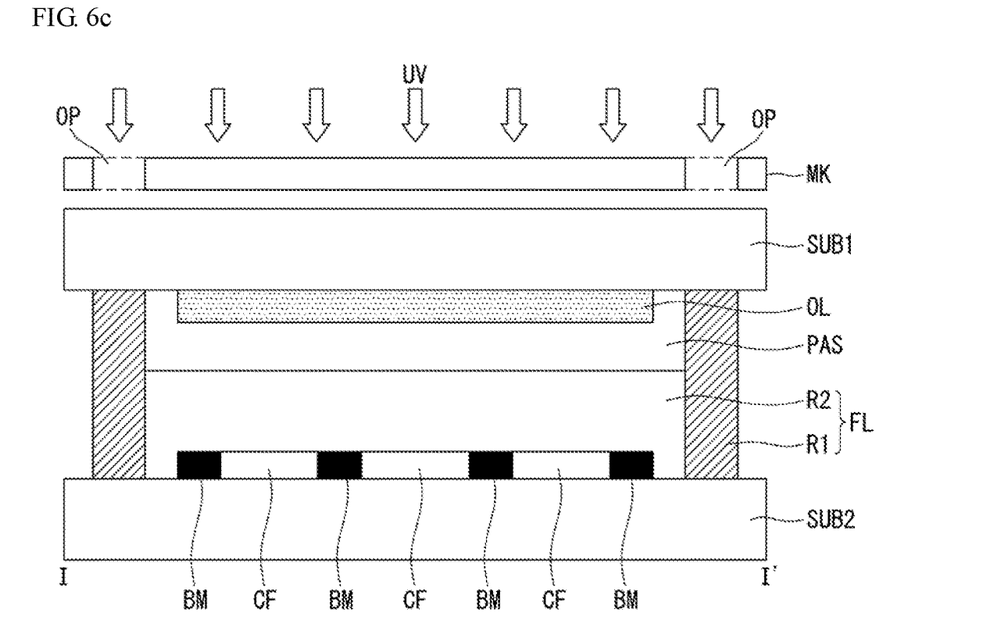

Referring to FIG. 6c, when the filling material FM fills the empty space between the first substrate SUB1 and the second substrate SUB2, ultraviolet ray UV is irradiated to the bezel area BA outside the active area AA on which the images are displayed. The ultraviolet irradiation may be performed using a mask MK having a shielding portion SP for blocking the ultraviolet ray and an opening OP for transmitting the ultraviolet ray.

The opening OP of the mask MK is formed along the rim of the area where the first and second substrates SUB1 and SUB2 are overlapped to each other. Also, the opening OP of the mask MK is set to have a predetermined width from the edge portion of the first substrate SUB1 when the mask MK is aligned on the first substrate SUB1. When the ultraviolet ray of about 1 J to 10 J are irradiated while the first substrate SUB1 and the second substrate SUB2 are attached together, the first region R1 of the filling material FM exposed to ultraviolet ray is cured, but the second region R2 is not cured.

Alternatively, the ultraviolet irradiation may be performed after forming a black matrix only in a region where the ultraviolet ray is blocked. In any case, the ultraviolet irradiation region is set to be spaced apart by an appropriate distance from the organic light emitting element layer OL so that the organic light emitting element layer OL is not damaged.

Figure 6D:
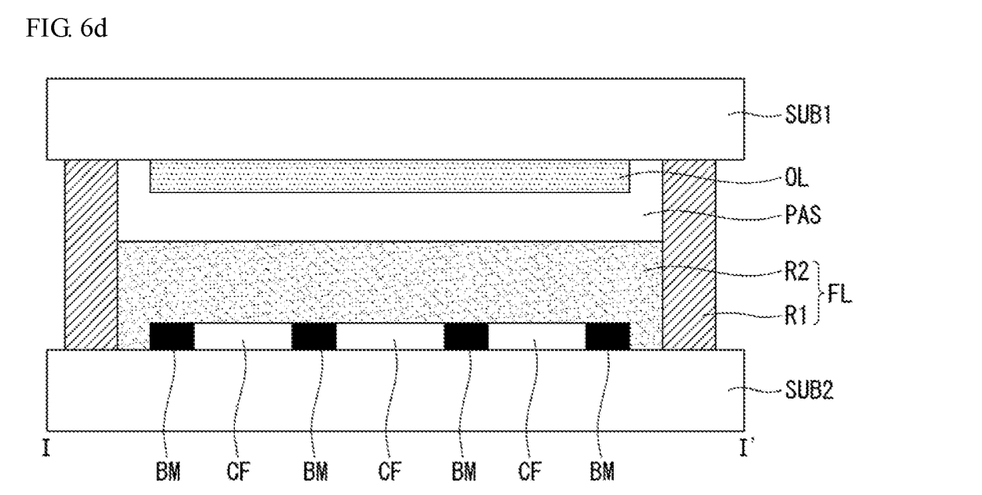

Referring to FIG. 6d, an entirety of the first and second regions R1 and R2 is heated for about 30 minutes to about 2 hours at temperature ranging from about 80° C. to about 100° C. after the filling material FM is divided into the first region R1 and the second region R2 having different hardness by the ultraviolet irradiation. As a result, the second region R2 that was in the uncured state is cured to form a filling layer FL. Thus, the filling layer FL including the first region R1 having a first hardness and a second region R2 having a second hardness less than the first hardness is formed from a single material.

In the sealing method of the organic light emitting display according to the first embodiment of this disclosure, the first substrate and the second substrate are irradiated with ultraviolet ray in a state of being attached to each other, but this disclosure is not limited thereto. For example, the ultraviolet irradiation may be performed by irradiating the ultraviolet ray onto the second substrate SUB2 on which the color filters CF and the black matrix BM for partitioning the color filters CF are disposed, immediately after the filling material FM formed of any one of acrylic-based resin, epoxy-based resin, silicone-based resin and rubber-based resin or a mixture thereof is applied. In this case, the ultraviolet curing is performed first, and then the first substrate and the second substrate are attached together. According to this, the spreading of the filling material can be suppressed before the first substrate and the second substrate are attached together because the applied filling material is partially filmed.

Therefore, when at least one of the first substrate and the second substrate is made of a flexible material such as polyimide, it is possible to reduce the filling material from being spread and to supplement insufficient adhesive force between the first substrate and the second substrate because the polyimide has an excellent ultraviolet absorbing ability.

Also, since the first region R 1 is cured according to the first cure by the ultraviolet irradiation to function as a dam, the spreading of the filling material FM is reduced, and also it is possible to decrease a misalignment between the first substrate SUB1 and the second substrate SUB2 even after the first substrate SUB1 and the second substrate SUB2 are attached together.

Also, since the first region R1 functions as a getter and does not generate a gas, it is possible to easily and safely absorb moisture being permeated from the outside.

Also, since the viscosity of the second region R2 is lowered according to the second cure by the thermal curing method, it is possible to effectively control that the filling material FM is spread to the first region R1.

As thus, according to the organic light emitting display device and the sealing method thereof according to the first embodiment of this disclosure, it is possible to obtain effects of reducing a manufacturing time and a complexity of the manufacturing process generated since the conventional sealant, getter, dam, and filling material are formed by using different materials and processes.

Figure 7:
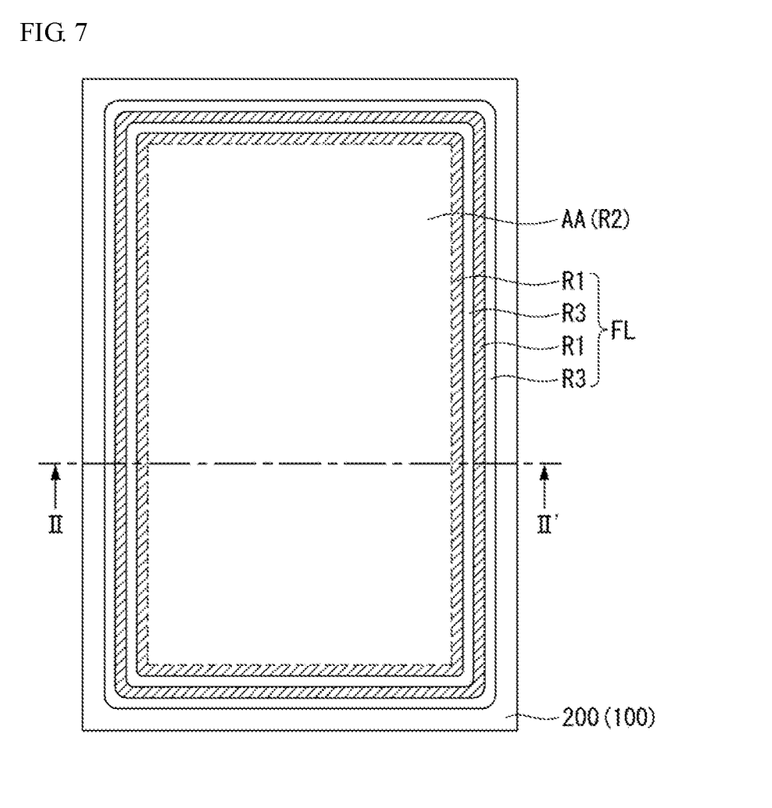
FIG. 7 is a plan view schematically illustrating an organic electroluminescent display device according to a second embodiment of this disclosure.

Next, referring to FIGS. 7 and 8, an organic electroluminescent display device according to a second embodiment of this disclosure will be described. FIG. 7 is a plan view schematically illustrating an organic electroluminescent display device according to a second embodiment of this disclosure, and FIG. 8 is a cross-sectional view taken along line II-II' of the organic electroluminescent display device according to the second embodiment of this disclosure shown in FIG. 7.

Figure 8:
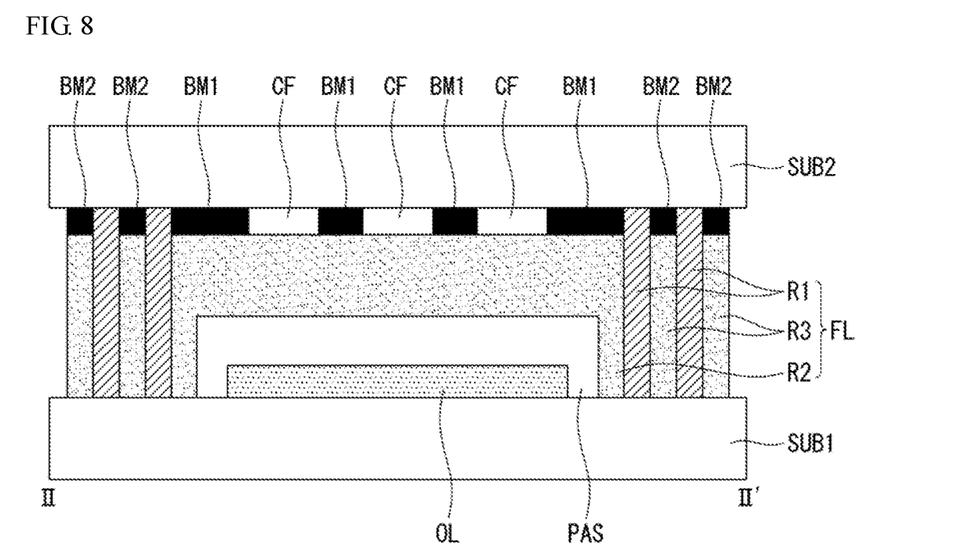
FIG. 8 is a cross-sectional view taken along line II-II' of the organic electroluminescent display device according to the second embodiment of this disclosure shown in FIG. 7.

Referring to FIGS. 7 and 8, the organic electroluminescent display according to the second embodiment of this disclosure includes a first substrate SUB1, an organic light emitting element layer OL and a passivation film PAS sequentially disposed on the first substrate SUB1, a second substrate SUB2, color filters CF disposed on the second substrate SUB2, a first black matrix BM1, at least one black matrix BM2 and a filling layer FL filled in a space between the first substrate SUB1 and the second substrate SUB2.

The organic light emitting element layer OL is a layer including display elements such as data lines, gate lines, thin film transistors, and organic light emitting diodes formed on the first substrate SUB1.

The passivation film PAS covers the organic light emitting element layer OL to block oxygen and moisture from being penetrated into the organic light emitting element layer OL. The passivation film PAS may consist of a plurality of layers in which an inorganic protective film and an organic protective film are alternately disposed. The inorganic protective film is more suitable than the organic protective film in blocking penetration of oxygen and moisture. The organic protective film can serve to complement the impact resistance of the inorganic protective film.

The first black matrix BM1 divides a plurality of color filters CF arranged in a matrix form in the active area AA so that the color filters adjacent to each other are not to be mixed with each other.

The second black matrix BM 2 is disposed to surround the active area AA at a predetermined interval in a bezel area disposed outside the active area AA. In the example of FIGS. 7 and 8, the second black matrix BM2 is shown as two, but this invention is not limited thereto, and may be composed of one or more than three, if necessary.

The filling layer FL is filled in a space formed by the passivation film PAS on the first substrate SUB1, and the color filters CF, the first black matrix BM1, and the second black matrix BM2 on the second substrate SUB2. Accordingly, the filling layer FL is positioned between the first substrate SUB1 and the second substrate SUB2 to support the second substrate SUB2 located at the upper side. The filling layer FL may include a material which can be cured in both ultraviolet ray and heat. The material of the filling layer FL may be any one of acrylic-based resin, epoxy-based resin, silicone-based resin and rubber-based resin, or a mixture thereof.

The filling layer FL includes a first region R1, a second region R2 and a third region R3. The first region R1 is positioned between the first black matrix BM1 and the second black matrix BM2, and between the second black matrices BM2 and BM2. The second region R2 is positioned innermost inside the first region R1. The third region R3 is in contact with the first area R1 and is positioned under the second black matrix BM2.

Since the first regions R1 of the filling layer FL are regions cured through an ultraviolet cure, and the second and third regions R2 and R3 are regions cured through a thermal cure, the first regions R1 has a strength higher than the strength of the second and third regions R2 and R3.

Thus, the first region R 1 of the filling layer FL can function as a dam and getter, and the second and third regions R 2 and R 3 can function as a sealant.

Next, the sealing process of the organic electroluminescent display device shown in FIGS. 7 and 8 will be described with reference to FIGS. 9a to 9d.

Figure 9A:
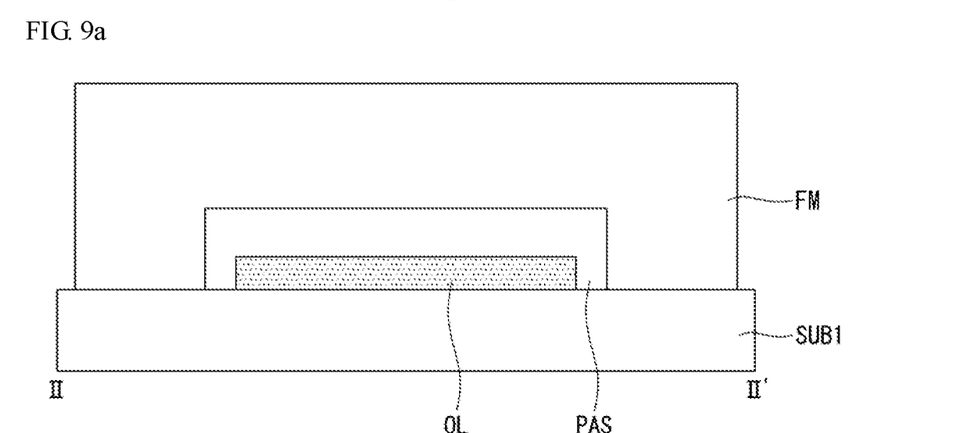
FIGS. 9a to 9d are cross-sectional views illustrating assembling processes of the organic electroluminescent display device shown in FIGS. 7 and 8.

Referring to FIG. 9a, a first substrate SUB1 on which the organic light emitting element layer OL and a passivation film PAS are disposed is prepared, and then a filling material FM made of any one of acrylic-based resin, epoxy-based resin, silicone-based resin, rubber-based resin or a mixture thereof is applied to the first substrate SUB1. The filling material FM has a viscosity of approximately 1,000 cp to 50,000 cp and is applied by a screen printing method, an ink-jet method, a slot dye coating method and so on.

Figure 9B:
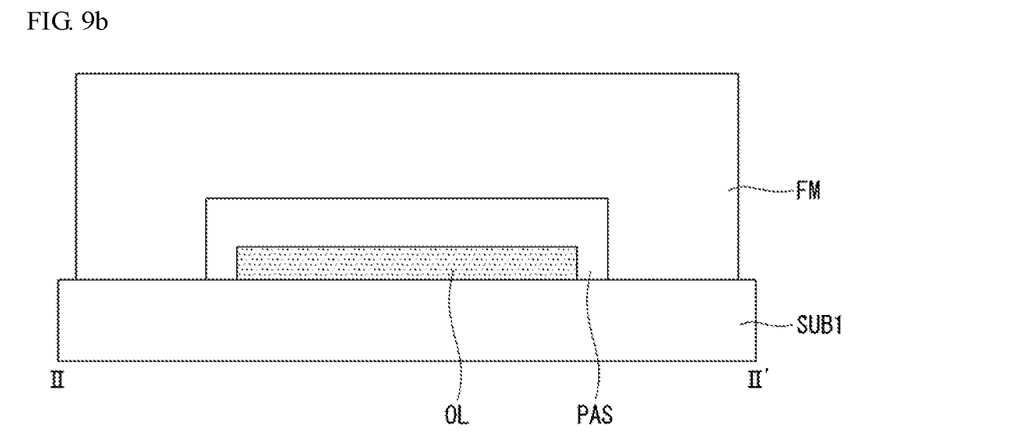

Referring to FIG. 9b, a second substrate SUB2 on which color filters CF, a first black matrix BM1 and a second back matrix BM2 are disposed, is prepared. The first black matrix BM1 partitions the color filters CF. The second black matrix BM2 is arranged to surround the first black matrix BM1 at a predetermined distance from the first black matrix BM1. The first substrate SUB1 and the second substrate SUB2 are aligned to face each other, and then the first substrate SUB1 is attached to the second substrate SUB2 by a vacuum attachment method and so on. The filling material FM positioned on the second substrate SUB2 by the attachment of the first substrate SUB1 and the second substrate SUB2 moves to the outside of the passivation film PAS and is filled into an empty space between the first substrate SUB1 and the second substrate SUB2.

Figure 9C:
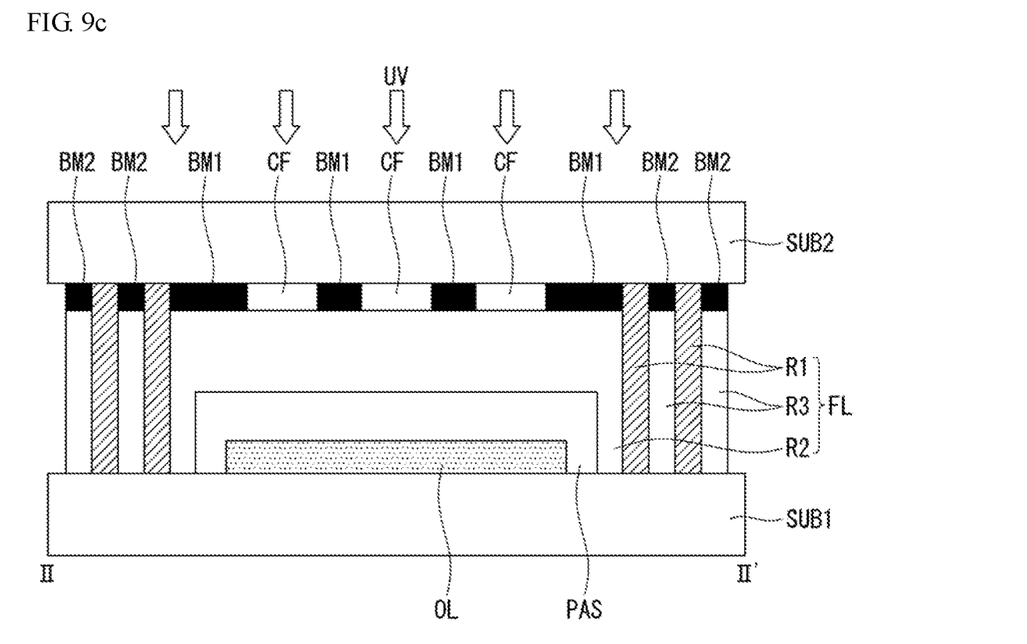

Referring to FIG. 9c, when the filling material FM fills the empty space between the first substrate SUB1 and the second substrate SUB2, ultraviolet ray UV is irradiated to the bezel area BA outside the active area AA on which the images are displayed. The ultraviolet ray UV is not irradiated to areas under the active area AA and the second black matrix BM2 because the ultraviolet ray UV is blocked by the color filters CF and the first black matrix BM1 disposed in the active area AA and the second black matrices BM2 disposed in the bezel area. Therefore, the first region R1 of the filling material FM exposed to the ultraviolet ray is cured, and the second and third regions R2 and R3 are not cured. The ultraviolet irradiation region is set to be spaced apart by an appropriate distance from the organic light emitting element layer OL so that the organic light emitting element layer OL is not damaged.

Figure 9D:
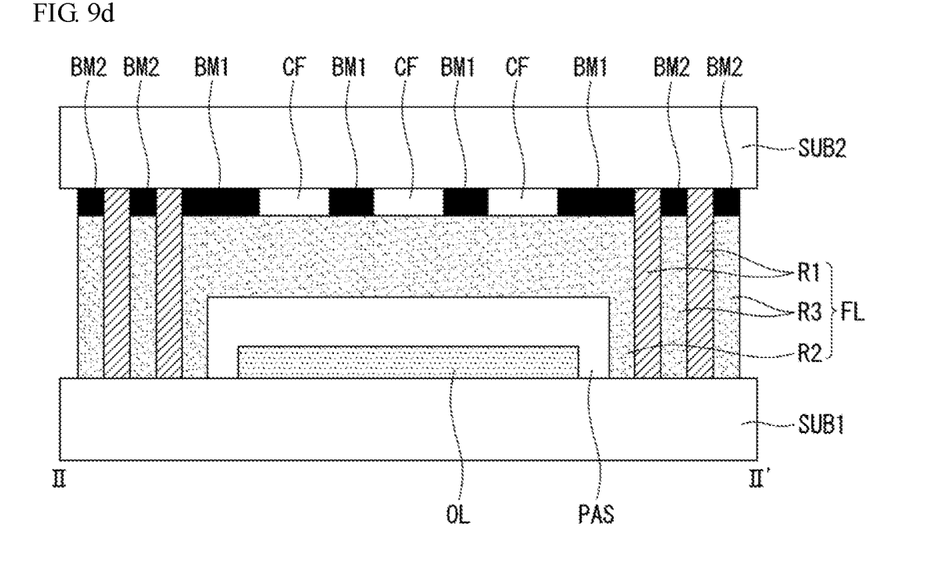

Referring to FIG. 9d, an entirety of the first to third regions R1 to R3 is heated for about 30 minutes to about 2 hours at temperature ranging from about 80☐ to about 100☐ after the filling material FM is divided into the first region R1 and the second and third regions R2 and R3 having different hardness by the ultraviolet irradiation. As a result, the second and third regions R2 and R3 that were in the uncured state are cured to form a filling layer FL. Thus, the filling layer FL including the first region R1 having a first hardness and the second and third regions R2 and R3 having a second hardness less than the first hardness are formed from a single material.

In the sealing method of the organic light emitting display according to the second embodiment of this disclosure, the first substrate and the second substrate are irradiated with ultraviolet ray in a state of being attached to each other, but this disclosure is not limited thereto. For example, the ultraviolet irradiation may be performed by irradiating the ultraviolet ray onto the second substrate SUB2 on which the color filters CF, the first black matrix BM1 for partitioning the color filters CF and the second black matrix BM2 are disposed, immediately after the filling material FM formed of any one of acrylic-based resin, epoxy-based resin, silicone-based resin and rubber-based resin or a mixture thereof is applied. In this case, an ultraviolet cure is first performed, and then, after the first substrate and the second substrate are attached together, a secondarily heat cure is performed. According to this, the spreading of the filling material can be suppressed before the first substrate and the second substrate are attached together because the applied filling material is partially filmed.

Therefore, when at least one of the first substrate and the second substrate is made of a flexible material such as polyimide, it is possible to reduce the filling material from being spread and supplement an insufficient adhesive force between the first substrate and the second substrate because the polyimide has an excellent ultraviolet absorbing ability.

Also, since the first region R1 is cured according to the first cure by the ultraviolet irradiation to function as a dam, the spreading of the filling material FM is suppressed, and also it is possible to decrease a misalignment between the first substrate SUB1 and the second substrate SUB2 even after the first substrate SUB1 and the second substrate SUB2 are attached together.

Also, since the first region R1 functions as a getter and does not generate a gas, it is possible to easily and safely absorb moisture being permeated from the outside.

Also, since the viscosity of the second and third regions R2 and R3 is lowered according to the second cure by the thermal curing method, it is possible to effectively control that the filling material FM is spread to the first region R1.

As thus, according to the organic light emitting display device and the sealing method thereof according to the second embodiment of this disclosure, it is possible to easily obtain the first region R1 functioning as a dam and a getter and the second and third regions R2 and R3 functioning as a sealant as much as desired by only the ultraviolet cure and the heat cure using a same material. Accordingly, it is possible to obtain effects of reducing a manufacturing time and a complexity of the manufacturing process generated since the conventional sealant, getter, dam, and filling material are formed by using different materials and processes.

It will be apparent to those skilled in the art that various modifications and variations can be made in this disclosure without departing from the spirit or scope of this disclosure. For example, in the embodiments of this disclosure, ultraviolet irradiation is performed on the second substrate side facing the first substrate on which the organic light emitting element layer is disposed, but this disclosure is not limited thereto. The ultraviolet irradiation is performed on the first substrate side. In this case, it is preferable to arrange wires so that an ultraviolet transmittance of the bezel region where the wires is concentrated is 30% or more. Accordingly, the technical scope of this disclosure is not limited to the contents described in the detailed description of the specification, but should be determined by the claims.

The invention claimed is:

1. An organic electroluminescent display device comprising:
   a first substrate including an active area and a bezel area outside the active area, the first substrate including an organic light emitting element and a passivation film covering the organic light emitting element thereon;
   a second substrate facing to the first substrate; and
   a filling layer in a space between the first substrate and the second substrate,
   wherein the filling layer includes;
      a first region having a first hardness, the first region including a first sub-region and a second sub-region, which are spaced apart from each other and disposed to support the first substrate and the second substrate in the bezel area;
      a second region having a second hardness lower than the first hardness, at a middle of the filling layer over the active area and covering the passivation film to be disposed inside the first sub-region; and
      a third region having a third sub-region disposed between the first sub-region and the second sub-region and a fourth sub-region outside the second sub-region, and
   wherein the first region, the second region and the third region are formed of a same material.

2. The organic electroluminescent display device of claim 1, wherein the first substrate further includes color filters on the passivation film, and a black matrix partitioning the color filters, and
   the second substrate is an encapsulating substrate.

3. The organic electroluminescent display device of claim 1, wherein the second substrate further includes color filters on the passivation film, and a first black matrix partitioning the color filters.

4. The organic electroluminescent display device of claim 1, wherein the first region is cured by ultraviolet rays and heat, and the second region is cured by heat.

5. The organic electroluminescent display device of claim 3, wherein the second substrate further includes at least one second black matrix spaced apart from the first black matrix by a predetermined distance and surrounding the first black matrix in the bezel area,
   wherein the third region overlaps the at least one second black matrix, and has a hardness less than the first hardness.

6. The organic electroluminescent display device of claim 5, wherein the third region is cured by heat.

7. The organic electroluminescent display device of claim 1, wherein the filling layer is made of a filling material cured in reaction to ultraviolet rays and heat.

8. The organic electroluminescent display device of claim 6, wherein the filling material includes any one of acrylic-based resin, epoxy-based resin, silicone-based resin and rubber-based resin, or a mixture thereof.

9. A display apparatus comprising:
   a lower substrate having an array of thin-film transistors (TFTs) in an active area;
   an upper substrate having an array of color filtering or light blocking elements; and
   a functional layer having a first hardness and a second hardness lower than the first hardness,
   wherein the functional layer, between the upper and lower substrates, is configured to provide getter and dam functions without need for a conventional getter and a conventional dam formed by separate processes, and also configured to minimize substrate misalignment due to an initial curing process that initially holds together the upper and lower substrates before a final curing process applied to the functional layer,
   wherein the functional layer includes:
      a first region having a first hardness, and a first sub-region and a second sub-region spaced apart from each other and disposed to support the lower substrate and the upper substrate in a bezel area of the lower substrate, a second region having a second hardness lower than the first hardness, at a middle of the functional layer over the active area and covering a passivation film of the lower substrate to be disposed inside the first sub-region, and a third region having a third sub-region disposed between the first sub-region and the second sub-region and a fourth sub-region outside the second sub-region, and wherein the first region, the second region and the third regions are formed of a same material.

10. The display apparatus of claim 9, wherein the functional layer includes:

a periphery region, corresponding to the bezel area, configured to be cured by the initial curing process for hardening to the first hardness; and an inner region, corresponding to the active area, configured to be cured by the final curing process for hardening to the second hardness.

11. The display apparatus of claim 10, wherein the functional layer is configured to be subject to the initial curing process that involves ultraviolet irradiation, and to be subject to the final curing process that involves heat.

12. The display apparatus of claim 11, wherein the function layer is made of any one among an acrylic-based resin, an epoxy-based resin, a silicone-based resin, a rubber-based resin, and a mixture thereof.

13. The display apparatus of claim 12, wherein the function layer has a viscosity within a range of 1,000 cp to 50,000 cp and is provided between the upper and lower substrates by any one among a screen printing method, an ink-jet method and a slot dye method.

14. The display apparatus of claim 13, further comprising:

organic light emitting elements over the array of TFTs on the lower substrate; and a protective layer covering the organic light emitting elements on the lower substrate to provide protection against oxygen and moisture.

15. The display apparatus of claim 14, wherein the functional layer, the upper layer and the lower layer are implemented in a top emission type OLED display panel.

* * * * *